United States Patent [19]
Gudesen et al.

[11] Patent Number: 6,055,180
[45] Date of Patent: Apr. 25, 2000

[54] ELECTRICALLY ADDRESSABLE PASSIVE DEVICE, METHOD FOR ELECTRICAL ADDRESSING OF THE SAME AND USES OF THE DEVICE AND THE METHOD

[75] Inventors: Hans Gude Gudesen, Gamle Fredrikstad; Per-Erik Nordal, Asker; Geirr Ivarsson Leistad, Sandvika, all of Norway

[73] Assignee: Thin Film Electronics ASA, Oslo, Norway

[21] Appl. No.: 09/147,680

[22] PCT Filed: Jun. 17, 1998

[86] PCT No.: PCT/NO98/00185

§ 371 Date: Feb. 12, 1999

§ 102(e) Date: Feb. 12, 1999

[87] PCT Pub. No.: WO98/58383

PCT Pub. Date: Dec. 23, 1998

[30] Foreign Application Priority Data

Jun. 17, 1997 [NO] Norway ................................. 972803

[51] Int. Cl.$^7$ ............................................... G11C 11/36
[52] U.S. Cl. ........................ 365/175; 243/105; 243/111
[58] Field of Search ............................. 365/175, 105; 365/243, 111

[56] References Cited

U.S. PATENT DOCUMENTS

| | | | |
|---|---|---|---|
| 3,612,758 | 10/1971 | Evans | 178/5.4 R |
| 3,681,754 | 8/1972 | Baasch | 340/168 R |
| 5,592,409 | 1/1997 | Nishimura et al. | 365/145 |
| 5,889,694 | 3/1999 | Shepard | 365/175 |

FOREIGN PATENT DOCUMENTS

| | | |
|---|---|---|
| 0 395 886 | 11/1990 | European Pat. Off. . |
| 0 721 189 | 7/1996 | European Pat. Off. . |
| 62-95882 | 5/1987 | Japan . |
| 62-95883 | 5/1987 | Japan . |
| 3-137894 | 6/1991 | Japan . |
| 3-137896 | 6/1991 | Japan . |
| 4-145664 | 5/1992 | Japan . |
| 972574 | 6/1997 | Norway . |
| WO 97/48009 | 12/1997 | WIPO . |

OTHER PUBLICATIONS

"Macromolecular Microstructures" Linköping Studies in Science and Technology Dissertation No. 432, Linköping 1996, pp. 49–51, 135–140 and 143–158.

"A new material for optical, electrical and electronic thin film memories" 1992 Pergamon Press Ltd., vol. 43, No. 11, pp. 1019–1023.

*Primary Examiner*—David Nelms
*Assistant Examiner*—David Lam
*Attorney, Agent, or Firm*—Jacobson, Price, Holman & Stern, PLLC

[57] ABSTRACT

An electrically addressable passive device for registration, storage and/or processing of data comprises a functional medium (1) in the form of a continuous or patterned structure (S) which may undergo a physical or chemical change of state. The functional medium (1) comprises individually addressable cells (2) which represent a registered or detected value or are assigned a predetermined logical value for the cell. The cell (2) is provided between the anode (3) and cathode (4) in an electrode means (E) which contacts the function medium in the cell and causes an electrical coupling therethrough, the functional medium having a non-linear impedance characteristic, whereby the cell (2) directly can be supplied with energy which effects a change in the state of the cell. In a method for electrical addressing of the passive device wherein the addressing comprises operations for i.a. detection and registration as well as further operations for writing, reading and switching of a logical value assigned to the cell, electric energy is applied directly to the functional medium of the cell in order to change its state and hence effect an addressing operation. Use in optical detector means, volumetric data storage devices or data processing devices.

42 Claims, 5 Drawing Sheets

ELECTRICALLY ADDRESSABLE PASSIVE DEVICE, METHOD FOR ELECTRICAL ADDRESSING OF THE SAME AND USES OF THE DEVICE AND THE METHOD

FIELD OF THE INVENTION

The invention concerns an electrically addressable passive device for registration, storage and/or processing of data, wherein the device comprises a functional medium in the form of a substantially layer-like continuous or patterned structure, wherein the functional medium can undergo a physical or chemical change of state by a suitable energetic influence, wherein the functional medium comprises individually addressable passive cells provided in a two-dimensional pattern, and wherein a given physical or chemical state in a cell represent a registered or detected value or are assigned a predetermined logic value for the cell, and a method for electrical addressing of a passive device for registration, storing and/or processing of data, wherein the device comprises a functional medium in the form of a substantially layer-like continuous or patterned structure, wherein the functional medium can undergo a physical or chemical change of state by a suitable energetic influence, wherein the functional medium comprises individually addressable cells provided in a two-dimensional pattern, wherein a given physical or chemical state in a cell represent a registered or detected value or are assigned a predetermined logic value for the cell, wherein the addressing comprises operations for detection of a registered or detected value in the cell and additional operations for writing, reading, erasing and switching of a logical value assigned to the cell, and wherein the method comprises supplying electrical energy directly to the functional medium of the cell for detecting or changing the physical and/or chemical state of the cell and hence cause an addressing operation.

The invention also concerns uses of the electrically addressable passive device and the method for its electrical addressing.

Particularly the invention concerns a logic device which may be used for data memories of the ROM type, the WORM type or for realising a data memory which may be erased and written once more, and a method for addressing of such memories by purely electronic means.

Even more particularly the invention concerns addressing of data memories wherein the memory medium substantially consists of organic materials and the addressing takes place over a passive matrix of electrical conductors which contacts the memory medium directly or indirectly.

BACKGROUND OF THE INVENTION

Electronic addressing or logic devices, for instance for storage or processing of data are at present synonymous with inorganic solid state technology, and particularly crystalline silicon devices. Even if such devices have shown themselves technically and commercially very successful, they are encumbered with a number of disadvantages. Particularly they are encumbered with a complex architecture which leads to high cost and a loss of data storage density. Within the large subgroup of volatile semiconductor memories based on inorganic semiconductor material, the circuitry must constantly be supplied with electric current with a resulting heating and high electric power consumption in order to maintain the stored information. Non-volatile semiconductor devices on the other hand avoid this problem with a resulting reduction in the data rate accompanied by high power consumption and large degree of complexity. A number of different architectures has been implemented for memory chips based on semiconductor material and reflects a tendency to specialization with regard to different tasks. Matrix addressing of memory locations in a plane is a simple and effective way of achieving a great number of accessible memory locations with a reasonable number of lines for electrical addressing. In a square grid with n lines in each direction the number of memory locations hence scales as $n^2$. In one form or another this is the basic principle which at present is implemented in a number of solid state semiconductor memories. In these cases however, each memory location must have a dedicated electronic circuit which communicates to the outside via the grid intersection point as well as a volatile or non-volatile memory element, typically a charge storage unit.

There has in the art been proposed a number of devices which are meant to realize addressable passive memory elements based on the use of an organic memory medium. Thus there is from JP-A-4-145664 (Takeda, assigned to Canon Inc.) known an organic electronic element wherein a thin film is provided between overlying and underlying electrodes, the underlying electrode being provided on a suitable substrate and the overlying electrode crossing the underlying electrode perpendicularly. By varying the electrical voltage between the electrodes the conductivity of the organic thin film is affected. This conductivity may be maintained permanently and used for representing a memory state in the thin film between a pair of electrodes. There is, however, given no indication how this method and device may be used for addressing in large passive matrices. JP-A-62-95882-(A) (Yamamoto, assigned to Canon Inc.) discloses a memory cell with a first underlying electrode formed by depositing copper on a glass substrate and over the electrode depositing a thin film of a charge-transfer organometallic complex, in this case Cu—TCNQ, whereafter an overlying electrode formed by depositing an aluminium paste on the thin film. If the electric potential of the first electrode is higher than that of the second electrode, the thin film is kept in a high resistance state until the electric field reaches a threshold intensity and is thereafter switched to a low resistance state. No indication is here given that such memory elements straightforwardly may be provided in large passive matrices. Generally it is, however, well known to form a memory device wherein the memory medium is a bistable switchable thin film in the form of an organic complex compound of the charge-transfer type, cf. also JP-A-62-95883 with the same inventor and applicant, wherein transistor switches are used in each memory element for addressing.

In JP-A-3-137896 (Taomoto, assigned to Matsushita Giken K.K) there is once more proposed a memory element which uses an organic thin film which may be switche bistably between a high resistance state and a low resistance state by application of an electric field and maintains the momentary resistance state after the electric field has been withdrawn. Further this element may change the state very fast at high temperature, but slower at low temperature. Again an organic thin film is located between an overlying and an underlying electrode and provided on a substrate. It is stated that the switching takes place faster and faster with increasing temperature, but nothing is said of the use of a memory element of this kind in large passive matrices and whether it is suitable for passive matrix addressing. Further there is from JP-A-3-137894 (Asakawa, assigned to Matsushito Giken K.K.) known to provide thin films between overlying and underlying electrode matrices. In the actual case the matrix is shown as a 6.11 matrix, hence with a total of 66 elements. The thin film is a vapour deposited phtalocyanine film. If a voltage higher than a threshold value is applied to an electrode intersection, an on state is stored. When a voltage equal to the threshold value is applied, the intersection point is irradiated with light, such that the on state is stored in this part and information supplied in the form of light may be written directly into the matrix. When a reversed voltage is applied to the intersection point, the on-state is erased. Hence a structure which realizes a memory function both with an electric signal and a light signal is obtained. Even if there here are used a 6.11 matrix, it is in no way evident that this bistable switchable memory element will function without error when addressing in a passive matrix with a large number of memory elements.

Finally there is in a paper by Z.Y. Hua & G.R. Chen, "A new material for optical, electrical and electronic thin film memories", Vacuum 43, No. 11, pp. 1019–1023 (1992), described a new category of eraseable memory media which allows the realisation of memory elements which may be switched bistably by supplying energy in the form of heat, electrical fields or light radiation under different conditions. These memory media are based on the above-mentioned organometallic charge-transfer complex M(TCNQ) formed in 7,7,8,8-tetracynoquinodimetan ($C_{12}H_4N_4$) which acts as an electron acceptor molecules with different metals (M) as electron-rich donors. Hua & Chen propose the use of M(TCNQ) in an electrically erasable memory by for instance forming a matrix of switching elements based on Cu(TCNQ) between a set of underlying electrodes, for instance of aluminium, and a set of overlying intersecting parallel electrodes, for instance of copper, which is oriented perpendicularly in relation to the underlying electrodes. The authors are aware of the sneak current problem when forming memory devices based on passive matrix addressing of this kind and hence in order to avoid erroneous read-out propose to add a layer of material between the Cu(TCNQ) film and the underlying electrode for forming a schottky barrier. Thus the problem with sneak currents is substantially eliminated and the use of M(TCNQ) in combination with the schottky barrier will hence be able to realize addressing of memory elements in large passive matrices. It is thus realized that in order to avoid the sneak current problem by addressing in large passive matrices of memory elements for storing of data, it is necessary to take the materials engineering conditions in regard. This is particularly important when one in addition to a pure memory function wishes to realize switching, registration or detecting functions in the matrix and wherein the current and voltage values may vary widely, such that a diode function is not always a necessary condition. It may also be the desired to combine the electrical addressing in a passive matrix with light emitting or light detecting devices, which make further demands on the material used, particularly when it is desired to realize passive matrices with for instance $10^8$ elements or cells per $cm^2$.

Generally it has turned out difficult to address bistable or multistable switchable memory media in passive matrices and the problems with both addressability and reliable detection only increases with increasing numbers of nodes in the matrix, such as comprehensive simulation tests conducted by the applicant have shown. The same tests have also established that these problems may be surmounted by use of suitable materials with special electric or electronic properties.

SUMMARY OF THE INVENTION

The first main object of the present invention is thus to provide an electrically addressable passive device which avoids the problems with the known semiconductor devices for storage of data and which makes possible addressing of a very large number of cells, for instance about $10^8$ in one $cm^2$ for registration, storage and processing of data in an all-electronic format and without comporting disadvantages such as complexity, high cost, high power consumption and volatile storage.

Further there is also an object of the present invention that the electrically addressable passive device shall be realized with a functional medium in the form of an organic material which offers possibilities for flexible technical solutions and a low cost far below that for corresponding devices based on inorganic crystalline semiconductors.

A second main object of the present invention is to provide a method for electrical addressing of passive device according to the invention and particularly it is the object that the method shall be realized as an addressing of a passive matrix in a wholly electronic format, wherein the functional medium in the passive device is formed by substantially organic materials and implements a very large number of cells, for instance about $10^8$ on one $cm^2$, for registration, storage and/or processing of data.

Finally there is also an object of the present invention to employ the electrical addressable passive device as well as a method for addressing in a passive matrix in order to implement an optical detector means or in order to implement a volumetrically organised addressable device for storage and/or processing of data.

The above-mentioned objects and advantages are achieved according to the invention with an electrical addressable passive device which is characterized in that the cell is provided between the anode and the cathode of an electrode means which directly or indirectly contacts the functional medium in the cell in order to effect a direct or indirect electrical coupling through the cell, whereby the cell directly can be supplied with electrical energy for detection of the physical or chemical state of the cell or a change in the physical or chemical state of the cell, that a plurality of substantially parallel electric conductors are provided on each side of the functional medium such that overlying and underlying conductors intersect each other in a substantially orthogonal mutual relationship, that the electrode means of the cell is formed in an intersection point between a respective overlying and underlying conductor such that the cells in the functional medium and their assigned electrode means form the elements of a matrix whose rows and columns are defined by respectively the overlying and underlying electric conductors which in the intersection points form the anodes and the cathodes of the electrode means, and that the functional medium of the cell has a non-linear impedance characteristic, said functional medium being formed as a homogenous or stratified structure comprising one or more substantially organic materials and with a method which according to the invention is characterized by providing the functional medium of the cell with a non-linear impedance characteristic, said functional medium being formed with a homogenous or stratified structure comprising one or more substantially organic materials, supplying electrical energy to the cell by providing the cell between the anode and the cathode in an electrode means which directly or indirectly contacts the substantially organic material in the cell, and applying to the cell an electric voltage which effects a direct or indirect electrical coupling through the cell.

According to the invention the electrically addressable passive device and the method according to the invention may be employed in an optical detector means and in a volumetric data storage device or data processing device.

According to the invention the cell preferably comprises a rectifying diode formed between the anode and the cathode, such that the device comprises an electrical network of such diodes.

It is according to the invention also preferable that the electric conductors are provided in or on the functional medium and contact this directly or that on each side of the functional medium and between this and the electric conductors a dielectric layer is provided such that the electric conductors contact the functional medium indirectly. Further it is preferable that the electric conductors are provided in or on a substantially layer-like substrate adjacent to the functional medium on each side thereof.

In order to realize for instance an optical detector means the electric conductor is in advantageous manner at least on one side of the functional medium formed of a transparent material.

In a preferred embodiment the organic material comprises a polymer material, the polymer material preferably being a conjugated polymer.

Preferably an organic material is an anisotropic electrical conducting material or has been added a substance which may emit light by application of electric energy, such that this organic material under influence of the emitted light and possibly heat generated by the electric energy applied can undergo a chemical reaction which effects a change in the impedance of the functional medium.

In a preferred embodiment an organic material has been added one or more substances which by application of electric energy may emit or detect light in different wavelengths or in different wavelength bands or been added fusible microcrystalline, preferably on or in the surface of this organic material.

In another preferred embodiment an organic material is a ferroelectric liquid crystal or a ferroelectric polymer. In a further preferred embodiment an organic material itself or a substance added to this organic material can transfer from a glass phase to an amorphous phase or vice versa or an organic material may be a multistable conformation reactive organic material.

In a preferred embodiment of the method according to the invention the cell is formed in the intersection point between respective substantially parallel electric conductors provided on each side of the functional medium such that an overlying and an underlying conductor intersects each other in a substantially orthogonal mutual relationship and comprise respectively the anode and the cathode of an electrode means for the cell, such that the cells in the functional medium and their assigned electrode means form elements in a matrix whose rows and columns are defined by respectively the overlying and underlying electric conductors.

Preferably electric energy is supplied by injection of electric charges in the cell.

Further in the method according to the invention it is preferred that the cell is formed with a highly non-linear voltage characteristic.

Preferably the method in the cell is formed with a rectifying diode.

Wherein an organic material has been added a substance which can emit light by application of electric energy such that the emitted light, possibly together with heat generated by the electric energy application, triggers a chemical reaction in this organic material, the impedance of the functional medium can be changed in an advantageous manner.

Wherein an organic material has been added one or more substances which by application of electric energy can emit light on different wavelengths or in different wavelength bands, it is preferred that spectral characteristics of the emitted light is changed by varying the voltage value of the applied electric energy. It is in this connection also advantageous that a logical value assigned to the cell is switched by applying a high voltage value to the cell and reading the logical value by detection of the light emission during an applied low voltage value, such that the cell emits long wavelength light which does not influence the physical or chemical state of the functional medium, the intensity of the long wavelength light being dependent on the logical value.

Wherein an organic material is a ferroelectric crystal or a ferroelectric polymer, it is preferred that a logical value assigned to the cell is detected by measuring the impedance of the cell.

It is also preferred that a logical value assigned to the cell is switched by the supplied electric energy changing the electrical conductivity of the functional medium by resistance heating.

Further it is also preferred that the logical value assigned to the cell is switched irreversibly by effecting an irreversible change in the electric conductivity of the functional medium or that the logical value is switched irreversibly by effecting an irreversible change in the interface between the functional medium and the anode respectively the cathode.

Wherein an organic material has been added fusible microcrystallites, it is preferred that the logical value assigned to the cell is switched irreversibly by effecting a fusing of the microcrystallites.

It may also be preferable that wherein an organic material itself or a substance added to this organic material can transfer from a glass phase to an amorphous phase a logical value assigned to the cell is switched irreversibly by effecting a transition between the glass phase and the amorphous phase or vice versa in said organic material or the substance added thereto.

Wherein an organic material is a multistable conformation reactive organic material, it is preferable that a logical value assigned to the cell is switched irreversibly by generating an electrical field in the cell.

BRIEF DESCRIPTION OF THE DRAWINGS

The invention shall now be discussed in more detail in connection with examples of embodiments of the electrically addressable passive device and the method according to the invention with reference to the appended drawings wherein FIG. 1a schematically and in perspective shows a preferred embodiment of a matrix addressable passive device according to the invention, FIG. 1b an equivalent diagram of the device in FIG. 1a realized as a diode network, FIG. 2 schematically an embodiment of a cell in the device in FIG. 1, FIG. 3 another embodiment of a cell in the device in FIG. 1, FIG. 4 the device according to the invention used in a volumetric data storage device or data processing device, FIG. 5 schematically the problem with so-called sneak currents or alternative current paths in an matrix addressable passive device according to the invention, FIG. 6 an example of addressing with generation of light emission in a cell, FIG. 7 an example of addressing using organic light emitting diodes in a cell, and FIG. 8 an example of addressing using a ferroelectric liquid crystalline material in the cell.

DETAILED DESCRIPTION OF THE PREFERRED EMBODIMENTS

Figure 1A:
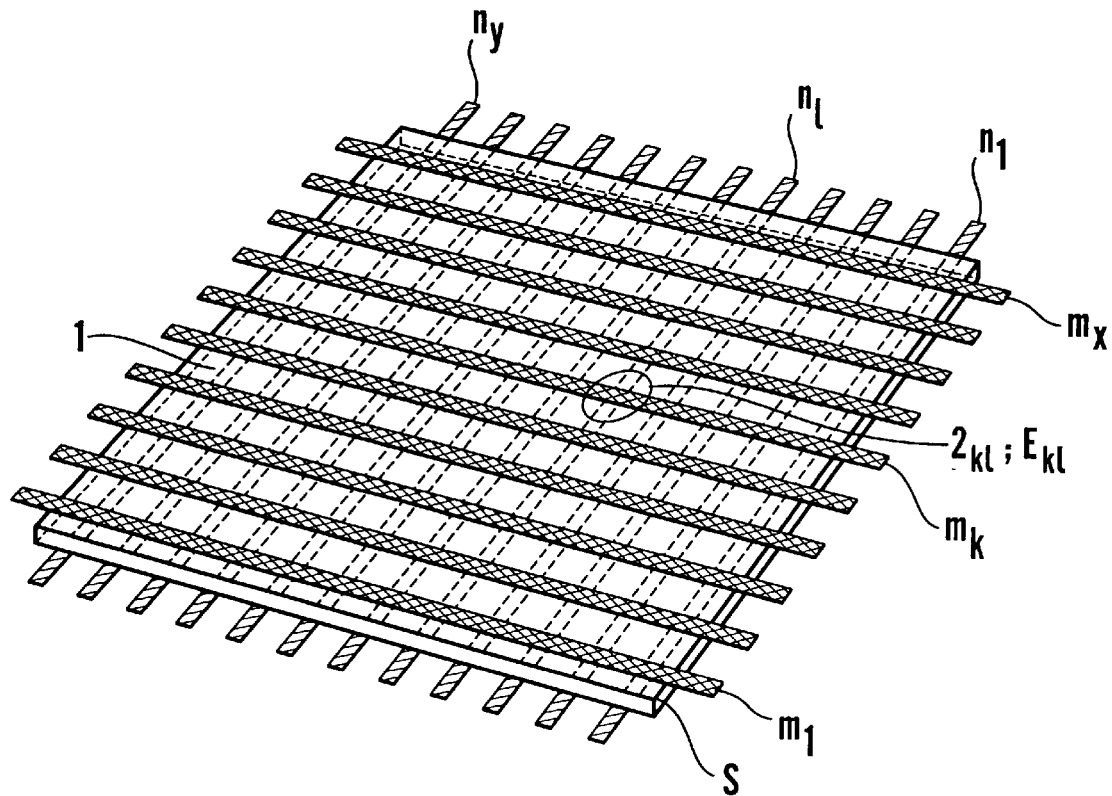
Figure 1B:
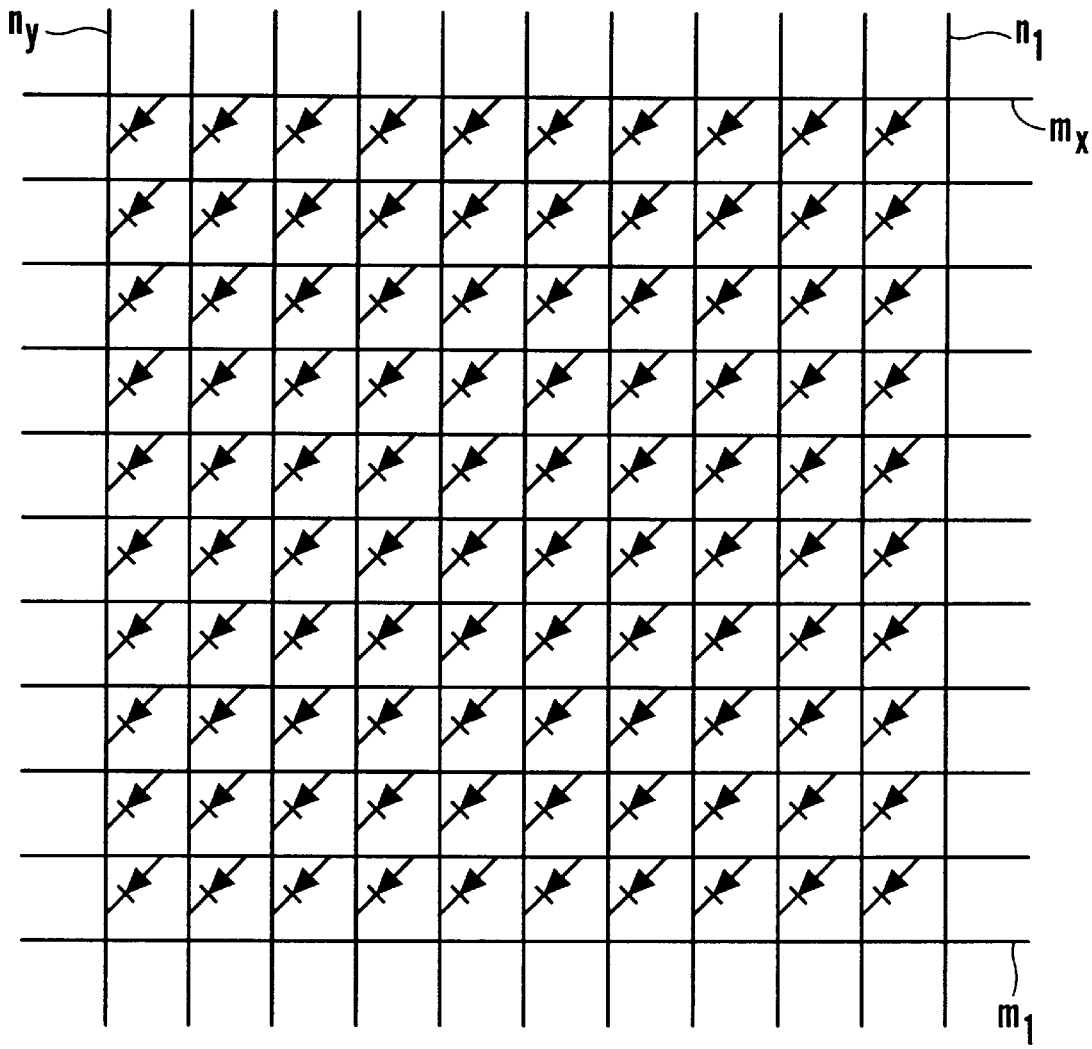

FIG. 1 shows the electrically addressable passive device according to the invention realized as a matrix addressable device. The functional medium 1 is provided in the form of a planar layer S. The functional medium is an organic material with non-linear impedance characteristic and possible with different substances added in order to realize desired detecting or switching functions. On the upper surface of layer S there are provided lines for electrical addressing in the form of a plurality of electric conductors m, and on the lower surface of the layer S there are correspondingly provided lines for electrical addressing in the form of parallel electric conductors n, the conductors m, n being provided mutually orthogonal such that they form a matrix. In FIG. 1 is the device shown with x conductors m and y conductors n such that the conductors form a planar orthogonal x, y matrix. A logic cell 2 in the device is generated in the volume between two intersecting electric conductors m, n. This is emphasized in FIG. 1a by the formation of an element $2_{kl}$ in the intersection point between the k'th conductor m and the l'th conductor n.—If all elements 2 are formed with a rectifying function, the device may be represented by an electric network of rectifying diodes, such as shown by the equivalent diagram in FIG. 1b.

The opposing portions of the conductor $m_k$ and $n_l$ in an intersection point comprises together the electrode means $E_{kl}$ of the logic cell $2_{kl}$, as the anode 3 in the electrode means may be the conductor $m_k$ and the cathode 4 in the electrode means the conductor $n_l$.—For several of the purposes of the present invention the cell $2_{kl}$ may as well be denoted as a logic element or logic cell, as the material or the functional medium in the cell by the addressing may assume different physical or chemical states which may represent electrically detectable logical values.

Figure 2:
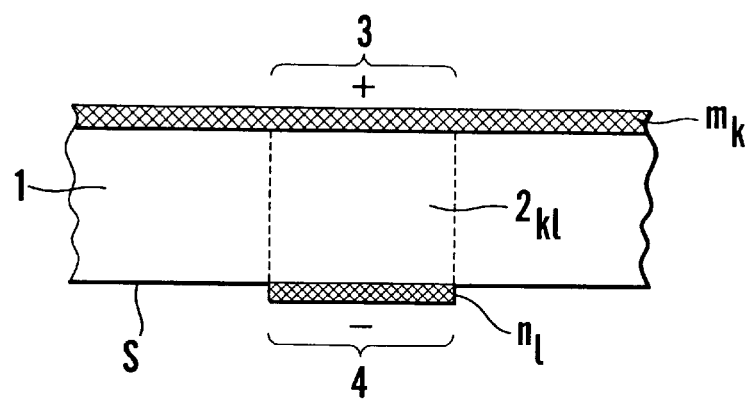

In section this is shown schematically in FIG. 2, wherein the functional medium 1 is provided in the form of a layer between the conductors $m_k$, $n_l$, the anode 3 and the cathode 4 of the electrode means $E_{kl}$, being comprised by respectively the relevant portion of the conductor mk and the relevant portion of the conductor $n_1$, in the intersection point between the conductors. In this intersection point, i.e. between the anodes 3 and the cathode 4, a passive logic cell is formed, in FIG. 2 denoted as $2_{kl}$ in order to indicate that it is located between the conductor $m_k$ and the conductor $n_l$. FIG. 2 is, of course, only a section of FIG. 1 and it is to be understood that the whole section taken alone the conductor mk will show a total of y logic cells 2 and y conductors $n_y$. If x≠y, the device, of course, forms a rectangular area with x y logic cells and if x=y, the device is square with $x^2$ cells.

Figure 3:
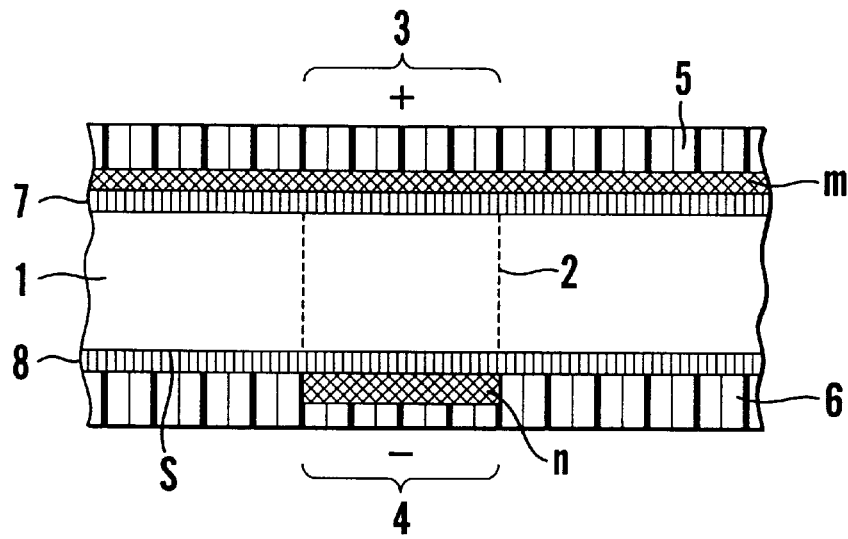

A more complex embodiment of the device according to the invention, exemplified as a section through a cell 2 is shown in FIG. 3. Here the electric conductor m is provided on a substrate 5, while the electric conductor n correspondingly is provided on a substrate 6. As shown in FIG. 2 the conductors m, n might contact the functional medium 1 directly, but in the embodiment in FIG. 3 it is further shown provided dielectric layers 7; 8 between respectively the conductors m; n or the substrates 5; 6. Hence the electrode means E by its anode 3 and its cathode 4 no longer contacts the functional medium 1 directly, but indirectly via the dielectric layer 7, 8, such that an indirect electric coupling is formed through the cell 2. This coupling could for instance be inductive or capacitive. If the dielectric layers 7, 8 are absent, the electrode means E will, of course, contact the functional medium 1 directly and a corresponding direct or ohmic coupling is obtained through the cell 2.

Briefly stated the volume between the anode 3 and the cathode 4 of the electrode means E, the scale of which roughly is defined by the widths of the conductors m, n and the distance therebetween, i.e. the thickness of the functional medium 1, defines a logic cell 2 which for instance forms a detector element in an optical detector or a memory element in a data storage device or a switching element in a data processing device.

The anode 3 and the cathode 4 which surrounds the functional medium 1 are included in the electrode means E which, when an electric voltage is applied thereto, will cause a physical or chemical change of state in the functional medium. This will cause a change in the electric impedance between the anode 3 and the cathode 4 and this impedance change can be detected on the electric conductors m, n which form the electrode means E in question. The logical state or the logical value in each intersection point between m and n or in each cell 2 may then be determined by measuring the electric impedance between the electric conductors m, n which form the electrode means E of the cell 2.

It shall here be remarked that there is an essential difference between the prior art matrix addressable logic devices, for instance data storage devices, and the present invention, as the latter employs a functional medium with non-linear impedance characteristic and formed by one or more organic materials and this has far-reaching implications in regard of constructional flexibility, operational features and costs. An important feature of using a functional medium of this kind is the possibility of an extensive use of purely passive addressing even in very large matrices, e.g. from $10^6$ to $10^8$ elements provident with a density of for instance $10^8$ elements per $cm^2$, as there will not be required any discrete active circuit elements in the intersection points.

Figure 4:
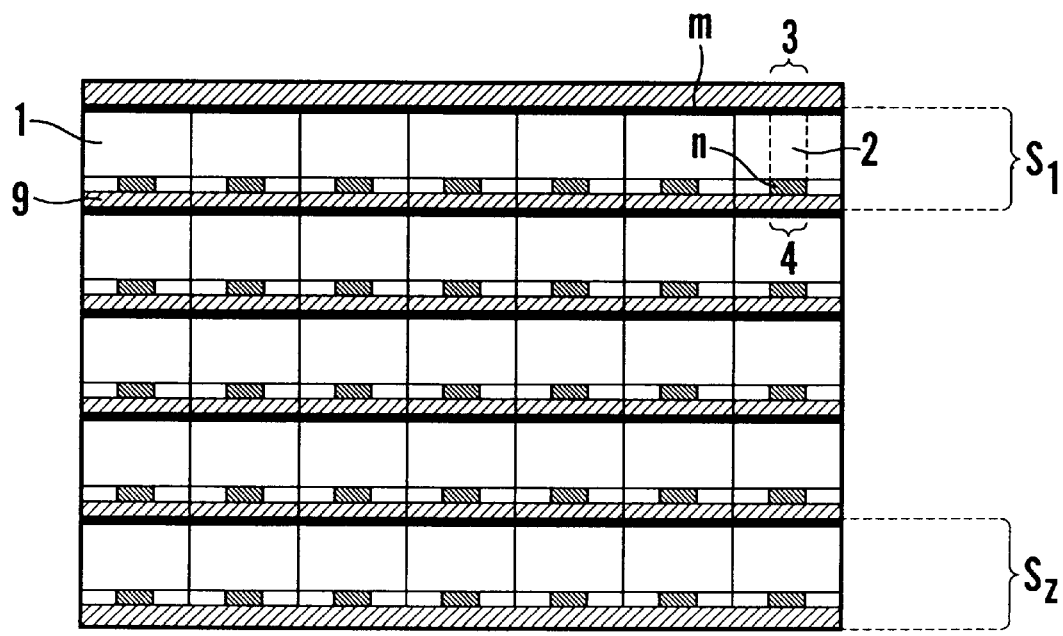

The device according to the invention forms a substantially plane layer-like structure S and this implies that it will be possible to stack such plane layer-like structures S layerwise and form a volumetric logic device, for instance a volumetric memory device. This may for instance be realized as in FIG. 4, wherein there is shown a volumetric device of this kind consisting of stacked layers of structures $S_1, \ldots S_z$ shown in section through a row of the cells 2 of the device, one of which is indicated in the figure. The embodiment of the logic device according to the invention and the method used for electrical addressing in a matrix-based format at the same time realize proximity addressing, i.e. the signals for addressing are conveyed in immediate connection to the functional medium 1 and influences this over the electrode means E which in FIG. 4 is shown for a logic cell 2 with respectively the anode 3 and the cathode 4 in the structure $S_l$. If several structures $S_l, \ldots S_z$ is stacked upon each other, they must be mutually isolated, preferably by an isolating layer 9 which may be electrically, thermally or optically isolating.

In principle each cell 2 of the device may have a very small extension, for instance of the magnitude of some ten nanometers and even less if the functional medium 1 for instance is based on layers of e.g. polymer materials. The thickness of the structure S becomes correspondingly small and hence it will be seen that the device according to the invention with the use of electrical addressing of the cell in proximity shall render it possible to implement a volumetric data storage device with very large capacity both with regard to storage density and transfer rates. The device according to the present invention has a close analogy in principally correspondingly implemented optical data storage devices based on proximity addressing and realized in volumetric embodiment. Such optical data storage devices are moreover disclosed and discussed in international patent application PCT/NO97/00154 which belongs to the present applicant and which hereby is included by reference, such that no further details shall be discussed in connection with the embodiment in FIG. 4 and the use of the device and the method according to the invention in volumetrically implemented data storage or data processing devices, but reference only made to what has been disclosed in the above-mentioned patent application.

Figure 5:
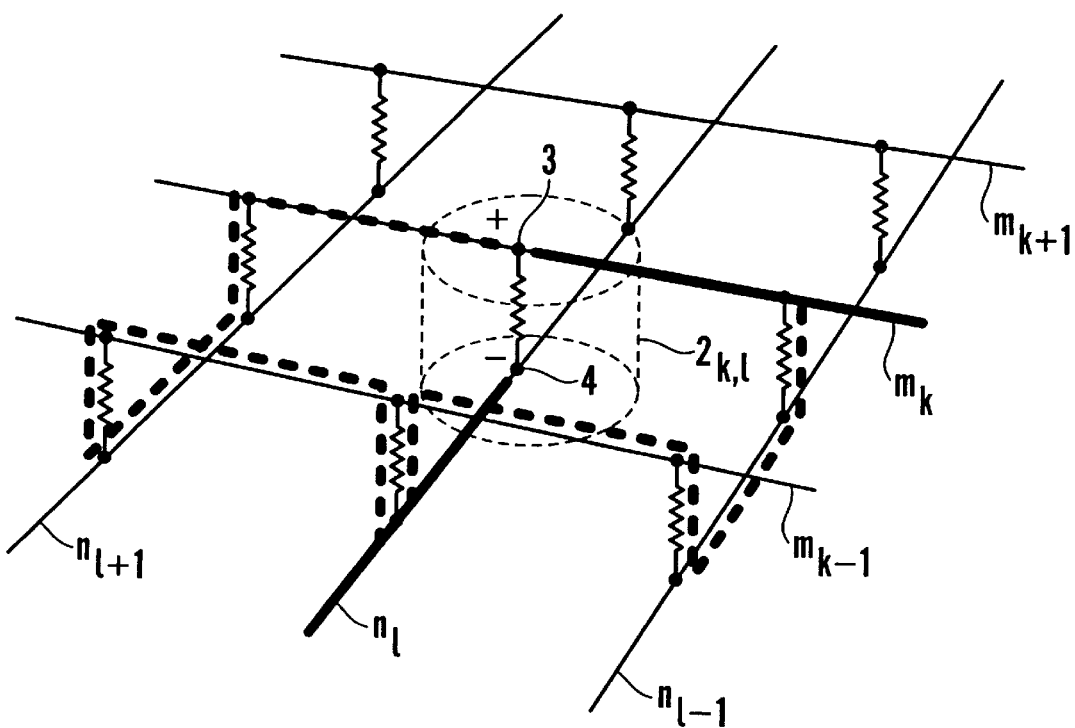

An important reason that the passive solid state memories have not been implemented in large scale, for instance with use of fusible resistances, is due to the problem with alternate current paths or so-called sneak currents in the network of electric conductors. This problem is schematically shown in FIG. 5, wherein the electric conductors once more is denoted by m, n and a logic cell $2_{kl}$ is shown formed in the intersection point between the conductor $m_k$ and the conductor $n_l$. If the logic cell 2 in each intersection point consists of an ohmic resistance such this is indicated in FIG. 5, this implies that the resistance change in given location x, y in the current conductor matrix due to the addressing operation will be masked by currents which are leaking through alternative loops as this is shown in FIG. 5, wherein the logic cell $2_{kl}$ in the position x=k and y=l shall be addressed, while current leaks along the stitched indicated current paths to neighbouring cells. The correct current path for the addressing on respectively conductors m and n is indicated with a broad continuous line. It is seen that the problem with sneak currents only are amplified if the size of the current conductor matrix increases, i.e. with the magnitude of the product xy. Two ways of avoiding the problem shall be discussed below, namely the use of rectifying diodes or materials with high impedance, for instance liquid crystals or a conformation reactive material.

In order to avoid the problem with sneak currents this may for instance take place by giving the electric connection in the intersection point. i.e. the cell, a highly non-linear current/voltage characteristic, something which will reduce or eliminate the sneak current problem. As will be evident from an inspection of FIG. 5, this may achieved by providing a rectifying diode in series with the resistance in each intersection point. It is consequently of essential importance for the present invention to form a network of such rectifying diode in a simple and reliable manner which comports low cost and at the same time is able to generate suitable data carrying structures in the form of adjustable and nonlinear impedances. By for instance using a functional medium with an organic material in the form of a conjugated polymer of the tiophene or PPV type and with a suitable choice of electrode material in relation to the organic material, it is possible to generate a diode junction at the interface between metal and organic material and this diode can be given very good rectifying properties. The electric coupling through the functional medium of the cell is controlled by the impedance properties of the latter. Addressing of the logic cell hence will imply a change in the impedance between the conductors m and n at an intersection point, for instance as shown in FIG. 5 between mk and n, and this may be achieved in a number of ways.

Below there shall now be given examples of preferred embodiments of the method for electrical addressing according to the present invention and primarily the examples will be directed towards writing and possibly reading of data in a logic cell.

EXAMPLE 1
Writing by Joule Heating

A high current which is sent through a logic cell provided at an intersection point x, y between electric conductors in, n will heat a functional medium based on organic conducting material. By judicious choice of material its bulk impedance can be changed reversibly or irreversibly by a current pulse and the changed impedance be read by measurement on the conductors m, n which form the electrode means E of the logic cell.

If the device according to the invention is implemented as a data storage device with high storage density, the logic cells will be very close together and it becomes important to avoid cross-talk in the form of thermal diffusion which causes an impedance change in neighbouring cells during a write operation. Hence it is mandatory to apply short write pulses, as the typical spatial definition which may be achieved can be expressed by the thermal diffusion length. The latter is a well-defined quantity which depends on bulk parameters as well as the geometry and the time characteristics of the heating pulse. Typically it will be necessary with pulse widths below 1 microsecond in order to achieve a spatial solution less than one micrometer.

Another form of cross-talk which is particularly relevant in reading of data is current spread between logic cells in a functional medium formed of organic bulk material. This may be avoided by using an organic material with a strongly anisotropic electric conductance, i.e. a high conductance through the cell between the anode 3 and the cathode 4, while the conductance in the extension direction of the structure S, i.e. along the layer or the plane formed by S and from memory cell to memory cell is low. —Polymer compounds with properties of this kind is by the way disclosed by M. Granstrom, "Macromolecular microstructures", Linköping Studies in Science and Technology, Dissertation No. 432, Linköping 1996, particularly pp. 49–51 and pp. 134–158; cf. M. Granström & al.: "Self organising polymer films—a route to novel electronic devices based on conjugated polymers", published in Supramolecular Science. —Ideally the impedance properties of the cells shall not be changed during read operations. This implies that thermally driven processes must be highly non-linear or threshold-dependent, i.e., that the functional medium shall not be influenced at low to moderate currents, but that there shall be a well-defined and steep transition at higher currents (non-linear impedance characteristic). Crystalline materials typically show thermally driven changes at a well-defined melting point. In amorphous materials as such as polymer and glass such transitions, however, takes place gradually over an extended temperature range and it is common to employ the less precise parameter softening temperature or glass transition temperature (the Vicat point).

There is ample experimental documentation that the lifetime of polymer-based diodes strongly depends on the operating conditions, as the main cause which leads to failure is Joule heating. Even with a poorly defined thermal transition temperature, such diodes however, very well satisfy the requirements which are given above in regard of distinguishing between the write and the read operation.

Melting point driven thresholding function may be achieved in polymers and other diode materials by incorporating microcrystallites in the conducting organic bulk material or by partly covering the contact surface between electrodes and the organic material therewith. One way of implementing the latter measure is electrode spraying of crystallites on the electrode surfaces before the device is mounted. The effects of the microcrystallites may consist in a mechanical rupture of the current path due to melting, for instance good wetting properties in relation to the electrode material in order to promote diffusion in the lateral direction, or release of active substances which inhibit the current propagation.

EXAMPLE 2
Writing by Light Generation

It is well-known that exposure to light may precipitate or accelerate chemical modifications in organic materials.

In one embodiment of the device according to the present invention the organic bulk material wholly or partly is formed of a light emitting organic compound which is activated by applying an electric current. Organic light emitting diodes (OLEDs) of this kind is at present under commercial development. Degradation mechanisms in OLEDs has been the subject of extensive investigations and an important result is shielding against the irradiation of the diode bulk material with ultraviolet or blue light, something which is essential in regard of achieving long lifetimes.

In the present invention the susceptibility of ultraviolet and blue light to generate an intense and controlled local irradiation by excitation of OLEDs which emit ultraviolet and/or blue light is exploited. As disclosed below, the effect of the irradiation which typically is accompanied by OLED Joule heating may be exploited in two different ways. The first of these is basing readout on detecting a change in impedance in the logic cell, the second of these is is basing readout on detecting a change in the light emitting properties of OLED.

In order to minimize power consumption and increasing the addressing speed, materials which are strongly susceptible to photo-induced state changes are chosen. This implies an optimisation which is exactly the opposite of what is usual in the manufacturing of OLEDs as well as the use of some interesting materials which formerly were rejected in connection with the development of OLEDs. In the present case there is, however, a very large decree of freedom with regard to choice of materials. It is hence possible to use interacting material systems which includes a light-sensitive photo initiator which is custom-made for specific stimulation of the light emitting component in OLED. Such measures may be directed towards both the functional medium in the logic cell and the material at the electrode surfaces.

Figure 6:
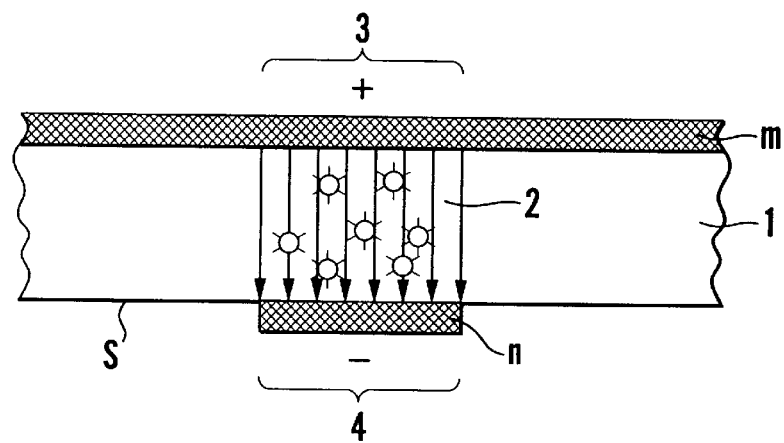

EXAMPLE 3
Writing by Internal Light Generation and Readings by Direct Impedance Measurement In this case the only function of the light is to initiate and/or accelerate the chemical modification of the functional medium 1 of the cell 2. A simple generic structure is shown in FIG. 6, wherein a polymer which emits ultraviolet and/or blue light is provided between the anode 3 and the cathode 4 of the electrode means and creates a rectifying junction at one of the interfaces. Biasing in the forward direction causes current flow thereto, light is emitted and interacts with the organic material of the cell 2. Simultaneously heat is generated and the relation between supplied electric energy dissipated as heat and used for generation of light, depends on the functional medium and the electrical excitation conditions. The combined effect of heat and light causes chemical changes in the cell by one or several pertinent mechanisms. One is chain separation in conjugated molecules, something which reduces the conductivity of the bulk material and changes the series resistance in each cell. Another mechanism is indirect, as the added chemical species becomes chemically reactive by the effect of light and attack the electrical conducting materials in the cell. One instance of the latter is the generation of free radicals by ultraviolet and/or blue light.

EXAMPLE 4
Writings and Reading by Internal Light Generation

Figure 7:
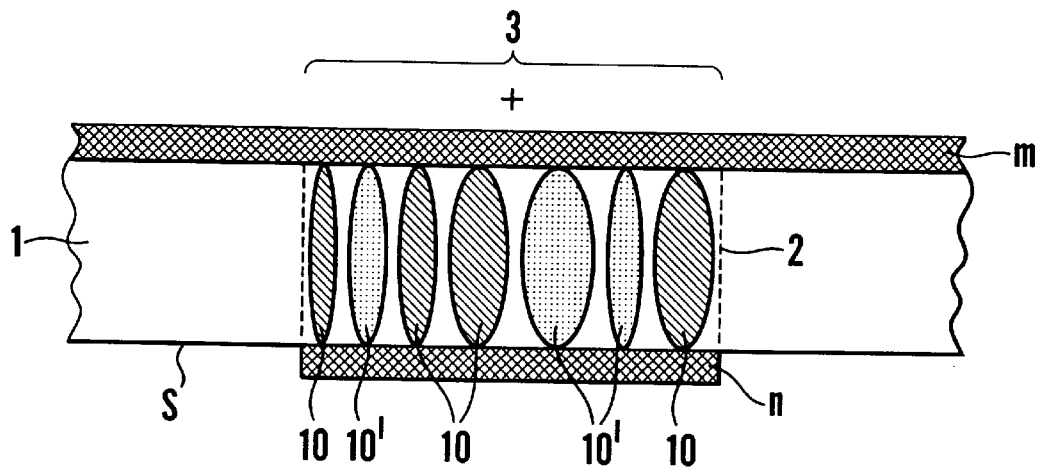

A generic structure is shown in FIG. 7. Herein each memory cell comprises a mixture of microscopic organic light emitting diodes (OLEDs) 10; 10' which respectively emits light in two or more wavelengths. OLEDs 10, 10' are in FIG. 7 shown as elliptical domains which extend between and contacts the anode 3 and the cathode 4. For instance domain 10 may then emit ultraviolet or blue light, while domain 10' may emit red light. Cells consisting of several OLEDs and domains may be embodied as shown in the paper "White light emission from a polymer blend light emitting diode" by M. Granström and O. Inganäs, Applied Phys. Lett. 68:2, pp. 147–149, 1996, cf. the above-mentioned dissertation by Granström, pp. 135–140, as the present invention may be based on OLEDs which emit in blue and red and which are provided randomly in the volume of the cell. Excitation with low voltage excites only OLEDs which emit red light, while a higher voltage also excites OLEDs which emit blue light.

Writing takes place by excitation at a high voltage such that the emission of blue light and increased heat dissipation reduce or destroy the light emission of OLEDs which emit red light. Once again the photosensitive additives may be applied as discussed in connection with example 3 above. Reading takes place by excitation at low voltage, such that only OLEDs which emit red light are activated and the heat generation becomes low. The irradiated power of the cell in question is monitored by a photodetector and the logic state of the cell can hence be determined.

EXAMPLE 5
Capacitive Logic Cells Based on Liquid Crystals

Figure 8:
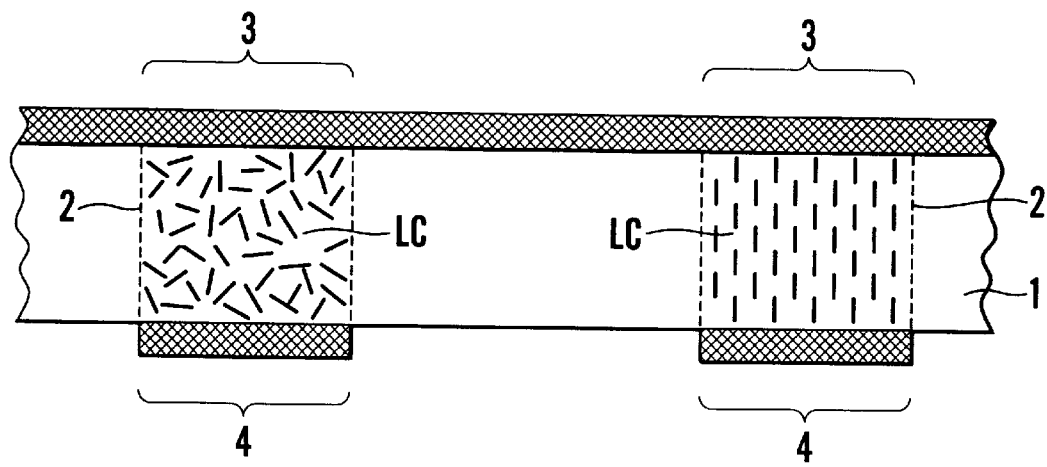

The sneak current problem which was mentioned above will not be present in passive matrix addressable logic devices with very high impedance at each intersection point, i.e. in the location of each single logic cell. A device with an extremely high ohmic resistance is shown in FIG. 8. A logic cell 2 contains bistable liquid crystal material (LC) provided between the anode 3 and the cathode 4 of the electrode means E. The logic state of the cell 2 is represented by the degree of molecular order in the LC, something which may be controlled by applying voltage to the electrode. The basic principle of this may be explained as follows. Suppose that the logic cell 2 on the left side of FIG. 8 is in a disordered state and represents a logical value 0. Application of polarizing voltage for writing alings the molecules of the liquid crystal and results in an ordered state which represent the logical value 1, shown by the logic cell 2 to the right in FIG. 8. Removing the voltage leaves the molecules in LC in the aligned ordered state and a non-volatile logic state is obtained. Thereafter the cell may return to the logic state 0 by applying a voltage pulse or a sequence of voltage pulses with a value which causes erasing. According to the present invention the logical value of the logic cell 2 is determined by detecting the difference in electrical impedance between the logic states 0 and 1 in the cell. As a concrete example the capacitance of the logic cell 2 may approximately be given as $C=C_0+C_1$, where $C_0$ is a contribution which weakly depends on the aligned state of the LC molecules, while $C_1$, is a contribution which explicitly is related to molecular alignment.

Reading of data involves determination of the degree of ordering of the LC molecules. $M_{LC} \approx f(C_1)$ is a direct measure of the orientational mobility of the LC molecules and will be different in respectively the 0 and 1 states. Two different preferred schemes for electrical excitation with regard to a determination of MLC shall be discussed. In order to visualise these in a simple manner the LC molecules are shown in FIG. 8 as rods with a random orientation in disordered state in the logic cell 2 at left in the figure. In the logic cell 2 at right in the figure the LC molecules are aligned alone the direction between the anode 3 and the cathode 4 and are in the ordered state. This does, however, not prevent that a more complex ordering may take place in logic cells based on a ferroelectric liquid crystal. In a first scheme a continuous alternating voltage (bipolar voltage) is applied to the electrode means and with a frequency which is sufficiently low to allow the LC molecules to react with a partial reorientation, i.e. $f \leq 1/\tau$ where $\tau$ is the time constant of small signal reorientation and f the frequency. If the molecules are relatively mobile, typical for a disordered state, a larger value will be detected for $M_{LC}$ than in the ordered state, wherein the molecules are locked along their local ordering vector.

In the second scheme the voltage level is applied to the electrodes and with a read voltage which is lower that the voltage used for writing. Dependent on whether the LC molecules are in the 0 state or in the 1 state they will have different orientational mobility and the size of $M_{LC}$ as derived from a measurement of the transient displacement current will contain information about the ordering of the LC molecules, hence the logic state of the logic cell. Both these schemes have their advantages and weaknesses. The scheme of applying continuous alternating voltage provides precision, but simultaneously leads to a reduction in the response time of the detection. The scheme with voltage steps gives detection in a time period which is $\leq \tau$, but represents a larger degree of technical complexity. In both cases a relatively high and threshold-defined write voltage simplifies the readout process. On the other hand a high write voltage must be balanced against the desirability of using low voltage drive electronics and power sources.

EXAMPLE 6
Electrically Switched Bistable Organic Films

Complex organic molecules, e.g. of biological origin, may have bistability or multistability, i.e. they may appear in different conformations. A class of molecules of this kind is bacteriorhodopsin and variants thereof or related compounds. The conformational reactive properties of bacteriorhodopsin with regard to use in an optical logic device is moreover closely discussed in NO patent application No. 972574 which belongs to the present applicant and which hereby is incorporated by reference.

A bistable memory device may be obtained on basis of the matrix addressable embodiment of the logic device as mentioned above. A thin film of e.g. bacteriorhodopsin may then for instance be the organic material in the functional medium 1. The thin film is preferentially aligned and switched between two bistable molecular conformations under influence of the electric field generated between the anode 3 and the cathode 4 in the electrode means E when voltage is applied thereto. Switchin, may take place reversibly and be performed a large number of times without exhausting the memory material. Reading takes place by applying a voltage above the switching threshold to the electrode means. If the cell in question already has been switched in a preceding write operation, there will be no further response in the cell on applying the read voltage. On the other hand, if the cell has not been switched, it will now respond. The switching is accompanied by an electric transient which may be sensed via an electronic circuit connected over the electrode means which drives the cell in question.

In order to obtain the desired properties in an electrically addressable passive device according to the invention the organic material in the functional medium must have a non-linear impedance characteristic. In addition to the organic materials discussed above, it may for instance be topical to use a ferroelectric polymer material in order to form capacitive cells. Another topical material may be organic based charge-transfer complexes with non-linear impedance characteristics, for instance the above-mentioned M(TCNQ) complex. If the device according to the invention shall be realized as an optical detector this may take place by using a functional medium wherein the organic material forms light sensitive diodes, for instance polymers corresponding to those which were used in the above-mentioned OLEDs. A light sensitive polymer with the desired spectral selectivity must then be used.

Realized as an optical detector it is to be understood that the device forms a detector array in a plane, e.g. any stacked configuration is not relevant. On the other hand the electrodes m,n in the electrode means E must at least on one side be formed from a transparent or translucent material, i.e. on the side of light incident. For instance the electrodes m or n may be of ITO (indium tin oxide) or a transparent or translucent polymer such as polypyrrol.

For a number of purposes there will in an optical detector of this kind be desired to be able to adjust the spectral selectivity, for instance with the intention of multispectral detection. This could take place by using an electrically tuneable optical filter over the transparent electrodes, for instance provided in the form of a continuous layer with a separate drive electronics. Another possibility would be the use of a light sensitive diode material whose spectral selectivity could be tuned electrically, such that tuning could take place directly over the electrode means E. At present this has turned out to be impossible in practice. A more closer alternative which is possible to accomplish in practice, would be to pattern the functional medium, i.e. not forming it as a continuous layer, but assigned separately to the singular cells. For instance could groups of three and three adjacent cells form a pixel in an RGB detector, with the cells in question in each pixel selective against red, green and blue light and addressed according to a protocol suitable for RGB detection.

The functional medium itself in the device according to the invention may be the deposited as a continuous layer between the electrodes in the electrode device. There is, however, nothing to prevent the functional medium being patterned, i.e. deposited under separate portions between the electrodes in each separate electrode means. In this case there will be no problem if the functional medium has an isotropic electrical conductivity. In addition the functional medium may be formed with homogenous structure, for instance comprising one organic material, possible with one or more additives. Such additives may themselves be inorganic or organic. However, there is nothing to prevent the formation of a functional medium with a stratified structure, such that the materials which comprises the functional medium is provided in layers between the electrodes in the electrode means. Each layer may then consist of different organic materials with the desired electric or electronic properties and possibly with inorganic or organic additives. Also in this case one and possibly several layers may be formed by an inorganic material. It may for instance be relevant to apply a combination of amorphous hydrogenated silicon (a-Si:H) adjacent to a polymer material, such that a hybrid inorganic/organic functional medium is obtained. If an organic based charge-transfer complex, for instance an organometallic complex such as (M(TCNQ) is used in the functional medium, the former must have a non-linear impedance characteristic, but can additionally be provided together with a semiconductor material provided adjacent to the electrodes on one or the other side of the functional medium, and which for instance may be gallium arsenide such that a schottky junction is obtained as per se known and discussed in the introduction, if it is desired to realize the functional medium with a diode function or a rectifying function, a stratified embodiment makes it possible to realize these functions in different technologies, for instance with use of PN, NPN, PNP or PIN junctions and possibly also in hybrid inorganic/organic embodiment. Stratified functional media also provide possibility of using light emitting or light detecting materials provided in separate layers if this is desired.

A person skilled in the art will realize that the logic device according to the present invention in a practical embodiment also will comprise drivers for the electrodes and wherein feed lines and current busses must be used in order to convey voltage to electric conductors m,n. The external supply of electrical energy to the logic device according to the invention may however be implemented in a number of ways which shall be well-known to persons skilled in the art and hence does not fall within the scope of the present invention and is consequently not discussed more closely in the above.

We claim:

1. An electrically addressable device for at least one of recording, storage and processing of data, said electrically addressable device comprising:

a functional medium in the form of a substantially layer-like continuous or patterned structure, the functional medium undergoing a physical or chemical change of state by a suitable energetic influence, the functional medium including a plurality of individually addressable passive cells provided in a two-dimensional pattern, the functional medium being realized as a homogenous or stratified structure comprising at least one substantially organic material, and a given physical or chemical state in a cell representing a recorded or detected value or are assigned a predetermined logic value for the cell, the cells being provided between the electrodes of an electrode means which directly or indirectly contacts said functional medium in each cell to effect a direct or indirect electrical coupling therethrough, whereby each cell can be supplied with electrical energy for detection of the physical or chemical state or a change in the physical or chemical state therein, a plurality of substantially parallel electric conductors being provided on each side of said functional medium such that overlying and underlying conductors intersect each other in a substantially orthognal mutual relationship, said electrode means for each cell being formed in an intersection point between a respective overlying and underlying conductor, such that said cells in said functional medium and assigned electrode means form the elements of a matrix whose rows and columns are defined by respectively the overlying and underlying electric conductors which in the intersection points form the electrodes of said electrode means, that said functional medium in each cell having an overall non-linear impedance characteristic, and that said at least one substantially organic material of said functional medium being a polymer material.

2. An electrically addressable device according to claim 1, wherein each cell comprises a rectifying diode formed between the anode and the cathode of said electrode means, such that the device forms an electrical network of diodes.

3. An electrically addressable device according to claims 2, wherein said rectifying diode is formed spontaneously by directly contacting said polymer material between the electrodes.

4. An electrically addressable device according to claim 3, wherein the electric conductors are provided in or on a substantially layer-like substrate adjacent to said functional medium on each side thereof.

5. An electrically addressable device according to claim 1, wherein the electric conductors are provided in or on said functional medium and contacts the functional medium directly.

6. An electrically addressable device according to claim 1, wherein a dielectric layer is provided on each side of said functional medium and between the functional medium and the electric conductors, such that the electric conductors contact said functional medium indirectly.

7. An electrically addressable device according to claim 1, wherein the electric conductors on at least one side of said functional medium are formed by a transparent material.

8. An electrically addressable device according to claim 1, wherein said polymer material is a conjugated polymer.

9. An electrically addressable device according to claim 1, wherein said polymer material is a ferroelectric polymer.

10. An electrically addressable device according to claim 1, wherein an organic material of said functional medium is an anisotropic electrical conducting material.

11. An electrically addressable device according to claim 10, wherein said anisotropic electrical conducting material includes separate electrical conducting domains surrounded by an electrical isolating material.

12. An electrically addressable device according to claim 11, wherein said conducting domains are formed by phase separation between at least two organic liquids which are distributed in the form of a substantially layer-like structure before the electric conductors and possible substrates for these are provided on both sides of said functional medium.

13. An electrically addressable device according to claim 1, wherein a substance which emits light by application of electric energy is added to an organic material of said functional medium, and the organic material under influence of the emitted light and heat generated by the electric energy applied undergo a chemical reaction which effects a change in impedance of the functional medium.

14. An electrically addressable device according to claim 1, wherein one or more substances are added to an organic material of said functional medium and emit or detect light on different wavelengths or in different wavelength bands by application of electric energy.

15. An electrically addressable device according to claim 1, wherein said functional medium comprises a ferroelectric liquid crystal.

16. An electrically addressable device according to claim 1, wherein said functional medium comprises fusible microcrystallites.

17. An electrically addressable device according to claim 1, wherein an organic material of aid functional medium or a substance added to the organic material transfer from a crystalline phase to an amorphous phase or vice versa.

18. An electrically addressable device according to claim 1, wherein an organic material of said functional medium is a multistable conformation reactive organic material.

19. An electrically addressable device according to claim 1, wherein an organic material of said functional medium is an organic semiconductor.

20. An electrically addressable device according to claim 19, wherein said organic semiconductor in each cell forms a diode junction either inherently or in conjunction with either electrode.

21. An electrically addressable device according to claim 1, wherein an organic material of said functional medium is an organic charge transfer compound.

22. An electrically addressable device according to claim 21, wherein said organic charge transfer compound is TCNQ (7, 7, 8, 8-tetracyanoquinodimethane) and forms a charge transfer complex with an electron donor.

23. An electrically addressable device according to claim 1, wherein said functional medium additionally comprises one or more inorganic semiconducting materials, provided in respective one or more separate layers.

24. An electrically addressable device according to claim 23, wherein an inorganic semiconducting material is amorphous hydrogenated silicon.

25. An electrically addressable device according to claim 23, wherein an inorganic semiconducting material forms a diode junction either inherently or in conjunction with either electrode.

26. The use of an electrically addressable device according to claim 1 in an optical detector means.

27. The use of an electrically addressable device according to claim 1 in one of a volumetric data storage device and data processing device.

28. A method for electrical addressing of a device for at least one of recording, storing and processing of data, wherein the device comprises a functional medium in the form of a substantially layer-like continuous or patterned structure, the functional medium undergoing a physical or chemical change of state by a suitable energetic influence, the functional medium including a plurality of individually addressable cells provided in a two-dimensional pattern, the functional medium being realized with a homogenous or stratified structure comprising at least one substantially organic material, a given physical or chemical state in a cell representing a recorded or detected value or assigned a predetermined logic value for the cell, the addressing comprises operations for detection of a recorded or detected value in the cell and additional operations for writing, reading, erasing and switching of logical value assigned to the cell, the method comprising:

supplying electrical energy directly to the functional medium of the cell for detecting or changing at least one of the physical and chemical state of the cell and hence causing an addressing operation, providing said functional medium of the cell with an overall non-linear impedance characteristic, providing a polymer material as the at least one organic material of said functional medium, applying electrical energy to a cell by providing said cell between an anode and a cathode in an electrode means which directly or indirectly contacts the functional medium in said cell, and applying an electric voltage to said cell and effecting a direct or indirect electrical coupling therethrough whereby the logical value of a cell is at least one of detected and switched.

29. A method according to claim 28, wherein said cell is formed in an intersection point between respective substantially parallel electric conductors provided on each side of said functional medium, and an overlying and an underlying conductor intersects each other in a substantially orthogonal mutual relationship and comprises respectively the electrodes in an electrode means of said cell, such that the cells in the functional medium and their assigned electrode means form elements in a matrix whose rows and columns are defined by respectively the overlying and underlying electric conductors.

30. A method according to claim 28, wherein said cell is provided with a highly non-linear voltage characteristic.

31. A method according to claim 28, wherein electric energy is supplied by injection of electric charges into said cell.

32. A method according to claim 28, wherein energy is supplied by generating electric fields in said cell.

33. A method according to claim 28, wherein a substance which can emit light by application of electric energy is added to an organic material of the functional medium such that the emitted light, together with heat generated by electric energy applied, triggers a chemical reaction in the organic material, and the overall impedance of said functional medium is changed.

34. A method according to claim 28, wherein one or more substances which by application of electric energy emit or detect light on different wavelengths or in different wavelength bands are added to an organic material of the functional medium, and the spectral characteristics of the emitted light is changed by varying the voltage value of the applied electric energy.

35. A method according to claim 34, wherein a logical value is assigned to a cell switched by applying a high voltage value to the cell, the logical value is read by detection of the light emission during an applied low voltage value, such that said cell emits long wavelength light which does not influence the physical or chemical state of the functional medium, the intensity of the long wavelength light is dependent on the logical value.

36. A method according to claim 28, wherein an organic material of the functional medium is a ferroelectric liquid crystal or a ferroelectric polymer, and a logical value assigned to a cell is detected measuring the impedance of said cell.

37. A method according to claim 28, wherein a logical value assigned to a cell is switched by the supplied electrical energy due to resistance heating changing the electrical conductivity of said functional medium.

38. A method according to claim 28, wherein a logical value assigned to a cell is switched irreversibly by effecting an irreversible change in the electrical conductivity of said functional medium.

39. A method according to claim 28, wherein a logical value assigned to a cell is switched irreversibly by effecting an irreversible change in the interface between said functional medium and either electrode.

40. A method according to claim 28, wherein fusible microcrystallites are added to an organic material of the functional medium, and a logical value is assigned to a logic cell switched irreversibly by effecting a melting of microcrystallites.

41. A method according to claim 28, wherein one of an organic material and a substance added to the organic material transfers from a crystalline phase to an amorphous phase or vice versa, and a logical value assigned to a cell is switched reversibly, the switching being caused by a transition between a crystalline phase and an amorphous phase or vice versa in said one of said organic material and in said substance added thereto.

42. A method according to claim 28, wherein an organic material of functional medium is a multistable conformation reactive organic material, and a logical value assigned to a cell is switched reversibly by generating an electric field in said cell.

* * * * *